(12) United States Patent
Wang et al.

(10) Patent No.: US 8,543,370 B2
(45) Date of Patent: Sep. 24, 2013

(54) MULTIPLE PLC SIMULATION SYSTEM

(75) Inventors: Gi Nam Wang, Gyenggi-do (KR); Jong Geun Kwak, Gyeonggi-do (KR)

(73) Assignee: UDMTEK Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/814,825

(22) PCT Filed: Mar. 22, 2012

(86) PCT No.: PCT/KR2012/002069
§ 371 (c)(1),
(2), (4) Date: Feb. 7, 2013

(87) PCT Pub. No.: WO2012/134101
PCT Pub. Date: Oct. 4, 2012

(65) Prior Publication Data
US 2013/0132059 A1    May 23, 2013

(30) Foreign Application Priority Data

Mar. 31, 2011    (KR) .......................... 10-2011-0029348

(51) Int. Cl.
G06F 9/44    (2006.01)
G06F 13/10    (2006.01)
G06F 13/12    (2006.01)

(52) U.S. Cl.
USPC ................................. 703/21; 703/13; 703/14

(58) Field of Classification Search
USPC ............................................... 703/13, 14, 21
See application file for complete search history.

(56) References Cited

U.S. PATENT DOCUMENTS 7,487,075 B2 * 2/2009 Martin et al. .................... 703/13
2008/0281575 A1 11/2008 Okamura et al. ............... 703/21

FOREIGN PATENT DOCUMENTS

| JP | 2001-209407 | 8/2001 |
| JP | 2003-162304 | 6/2003 |
| JP | 2006-155158 | 6/2006 |
| KR | 10-1132358 | 4/2012 |

OTHER PUBLICATIONS

Office Action, dated Aug. 25, 2011, issued in KR Application No. 10-2011-0029348 with English translation.

(Continued)

*Primary Examiner* — Saif Alhija
(74) *Attorney, Agent, or Firm* — Harness, Dickey & Pierce, P.L.C; Anthony G. Fussner; Kisuk Lee

(57) ABSTRACT

A multiple programmable logic controller (PLC) simulation system is provided. The multiple PLC simulation system includes a plurality of personal computers (PCs), each being configured to comprise a different software PLC which is one of a plurality of PLCs implemented as software in an effort to verify a plurality of PLC codes that generate a PLC input signal and a PLC output signal for controlling lines and equipment of an automated manufacturing system; and a simulation device configured to be connected to a plurality of the PCs over a network, and to perform simulation for verification of a plurality of the PLC codes using an input/output model and a graphic model where the input/output model defines as discrete events operation states of the lines and the equipment which are controlled according to the PLC output signals received from a plurality of the software PLCs and PLC input signals in accordance with the operation states, and the graphic model represents graphically motion change of the lines and the equipment in accordance with a change of operation states using pieces of motion graphic data of the lines and the equipment which correspond to the operation states and the graphic model generates PLC input signals including information on the motion change of the lines and the equipment.

6 Claims, 2 Drawing Sheets

(56) References Cited

OTHER PUBLICATIONS

Office Action, dated Nov. 28, 2011, issued in KR Application No. 10-2011-0029348 with English translation.

Allowed Claims in KR 10-2011-0029348 (Reg No. 10-1132358), issued on Apr. 3, 2012, English translation.
International Search Report (ISR) in PCT/KR2012/002069, dated Nov. 29, 2012.

* cited by examiner

MULTIPLE PLC SIMULATION SYSTEM

CROSS-REFERENCE TO RELATED APPLICATIONS

This application is a national phase application of PCT Application No. PCT/KR2012/002069, filed on Mar. 22, 2012, which claims the benefit and priority to Korean Patent Application No. 10-2011-0029348, filed Mar. 31, 2011. The entire disclosures of the applications identified in this paragraph are incorporated herein by references.

TECHNICAL FIELD

The following description relates to a programmable logic controller (PLC) simulation system, and more particularly, to a simulation technique for verifying a plurality of PLC codes by implementing a plurality of PLCs as software, which control lines and equipment of an automated manufacturing system, and connecting the PLCs over a single network.

BACKGROUND ART

As industries have been rapidly developed and advanced, an automated manufacturing system is evolving fast than ever. With the development of industries, a conventional automated manufacturing system needs to be changed into a new automated manufacturing system, and the delay of introduction of a new automated system may incur a great loss of profit and credibility of a manufacturer.

Various automated equipment which constitute an automated manufacturing system are controlled and operated by a programmable logic controller (PLC). The PLC stores therein ladder diagram information as a control program in the form of Boolean logic.

Pieces of automated equipment of the automated manufacturing system are operated by PLC output signals output from the PLC. The process state during operation or after operation may be monitored by a sensor and transmitted to the PLC in the form of a PLC input signal. The PLC input signal is a signal containing information on the updated process state.

The PLC performs internal logic operation in response to the PLC input signal to output a PLC output signal. The PLC output signal is a signal that instructs pieces of automated equipment to perform the next process according to the updated process state. The automated equipment performs processes, which accord with the updated process state, in response to the PLC output signal.

To run an automated manufacturing system in practice, a process control operator may manually write a control program for the automated manufacturing process by including PLC code, and make a test run of the control program by applying it to real equipment of the system. However, since the control program may have inherent human error, the manufacturing control operator needs to test the automated manufacturing system prior to the test running with respect to ladder diagram that includes the PLC code.

For quick introduction of an automated manufacturing system, it is general to test the automated manufacturing system, and control engineers thus have paid growing attention to control program test for the automated manufacturing system. In addition, control program verification after satisfactory design of PLC is a prerequisite for introducing an automated control system.

As an example of a simulation method for verification of PLC code that controls a plurality of lines in the automated manufacturing system, lines of the automated manufacturing system are divided on the basis of a unit of PLC control and simulation is performed for verification of individual software PLC code corresponding to each PLC control unit as shown in FIG. 1. As another example, an OLE for process control (OPC) server and a plurality of hardware PLCs are connected to each other for OPC communication and simulation is performed for PLC code verification in units of lines through the OPC communication as shown in FIG. 2.

Referring to FIG. 1, a PLC simulation program uses an input/output model that defines operational characteristics of field equipment as discrete events and a graphic model that defines operation states of the field equipment in an effort to verify whether a logic operation is normally performed in response to PLC input/output signals communicated with a software PLC.

Referring to FIG. 2, a plurality of hardware PLCs which control lines of an automated manufacturing system form a network, input/output code signal values of individual hardware PLCs are integrated and registered in the OPC server, and the registered input/output code signal values are associated with a PLC simulation program to verify whether to perform an independent logic operation in each PLC or whether to perform a logic operation with respect to other hardware PLCs.

However, in the simulation method shown in FIG. 1 in which the lines of the automated manufacturing system are divided on the basis of a unit of PLC control and simulation is performed for verification of individual software PLC codes that correspond to each PLC control unit, the automated manufacturing system that controls a plurality of the lines and the equipment cannot be implemented as software because the simulation for code verification is allowed to be performed by each PC for only one software PLC according to a PLC vender type. Moreover, the aforementioned simulation method in which the verification of one software PLC code is performed by one PC cannot verify errors and abnormal states which may occur during communication of input/output signals between each software PLC and human machine interface (HMI) in an actual automated manufacturing system that consists of a network of PLCs.

On the other hand, in a case where a plurality of the hardware PLCs are connected to the OPC server and simulation is performed for PLC code verification in units of lines as shown in FIG. 2, control logic configuration based on a plurality of the hardware PLCs may allow the PLC control simulation in units of lines, while environment settings for the PLC control simulation are complex and cost for PLC code verification is increased due to a communication environment established by a plurality of the hardware PLC and the OPC server.

DISCLOSURE OF INVENTION

Technical Problem

The following description relates to a multiple programmable logic controller (PLC) system which performs simulation for verification of a plurality of PLC codes in units of lines using a plurality of software PLCs which are PLCs that control lines and equipment of an automated manufacturing system and are implemented as software.

Solution to Problem

In one general aspect, there is provided a multiple programmable logic controller (PLC) simulation system comprising: a plurality of personal computers (PCs), each being configured to comprise a different software PLC which is one of a plurality of PLCs implemented as software in an effort to verify a plurality of PLC codes that generate a PLC input signal and a PLC output signal for controlling lines and equipment of an automated manufacturing system; and a simulation device configured to be connected to a plurality of the PCs over a network, and to perform simulation for verification of a plurality of the PLC codes using an input/output model and a graphic model where the input/output model defines as discrete events operation states of the lines and the equipment which are controlled according to the PLC output signals received from a plurality of the software PLCs and PLC input signals in accordance with the operation states, and the graphic model represents graphically motion change of the lines and the equipment in accordance with a change of operation states using pieces of motion graphic data of the lines and the equipment which correspond to the operation states and the graphic model generates PLC input signals including information on the motion change of the lines and the equipment.

Each of the PCs may be further configured to comprise a PLC wrapper configured to transmit to the software PLC the PLC input signal received from the simulation device through the network, and to transmit the PLC output signal received from the software PLC to the simulation device through the network, and the software PLC configured to perform an internal logic operation according to the PLC input signal received from the PLC wrapper to generate the PLC output signal and to transmit the generated PLC output signal to the PLC wrapper.

The simulation device may be further configured to comprise a PLC broker configured to transmit to a simulator the PLC output signals received from a plurality of the PCs through the network and to transmit, through the network, a plurality of the PLC input signals, which have been received from the simulator, to the corresponding PCs that generate the respective PLC output signals from which the individual PLC input signals are derived, and the simulator configured to comprise an input/output model unit and a graphic model unit, the input output model unit being configured to store the input/output model that defines as discrete events the operation states of the lines and the equipment which are controlled according to the PLC output signals received from a plurality of the software PLCs and the PLC input signals in accordance with the operation states and the graphic model unit being configured to store the graphic model which graphically represents a motion change of the lines and the equipment in accordance with a change of the operation states using pieces of graphic data of the lines and the equipment corresponding to the operation states and which generates the PLC input signals including information on the motion change of the lines and the equipment.

The simulation device may be configured to identify whether the PLC codes work normally or not based on a change of operation states of the lines and equipment in the input/output model wherein the operation states are controlled by the software PLCs according to the PLC output signals received from the software PLCs.

The network may be a transmission control protocol/Internet protocol (TCP/IP) network.

Advantageous Effects of Invention

According to a multiple PLC simulation system in accordance with an embodiment of the present invention, a plurality of software PLCs which are PLCs that control lines and equipment in an automated manufacturing system and are implemented as software connected through a single network, and simulation is performed for verification of a plurality of PLC codes. Consequently, drawbacks of a conventional simulation method for PLC code verification in which lines and equipment of an automated manufacturing system are divided on the basis of a unit of PLC control and simulation is performed for verification of individual software PLC codes that correspond to each PLC control unit may be enabled to be solved. More specifically, in the conventional simulation method, a network communication environment cannot be established between a plurality of software PLCs that control the lines and the equipment because simulation for code verification is allowed to be performed by each PC for one software PLC according to a PLC vender type, and as a result, verification of errors and abnormal states which may occur during communication of input/output signals between each software PLC and human machine interface (HMI) cannot be carried out.

Moreover, a network consisting of the software PLCs substitute for a conventional OLE for process control (OPC) server and hardware PLCs which are connected to the OPC server to perform a conventional simulation for PLC code verification in units of lines, and hence, environment settings for implementing PLC control simulation in units of lines can be simplified and cost for PLC code verification can be reduced.

Figure 1:
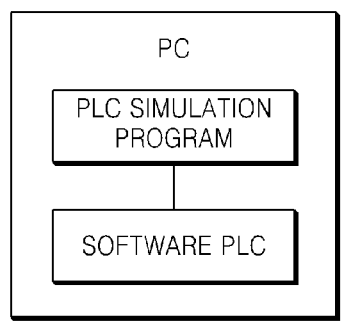
FIG. 1 is a diagram illustrating an example of a configuration of a conventional simulation system which divides lines of an automated manufacturing system on the basis of a unit of programmable logic controller (PLC) control and performs simulation for verification of individual software PLC codes corresponding to the unit of PLC control.
Figure 2:
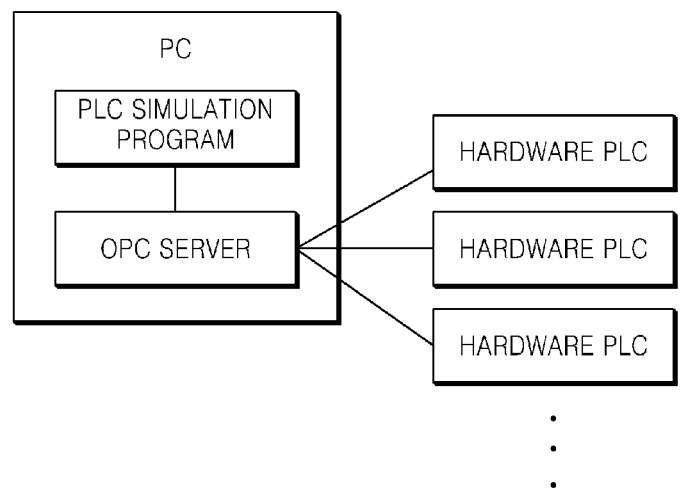
FIG. 2 is a diagram illustrating an example of a configuration of a conventional simulation system for verifying PLC code in units of lines through an OLE for process control (OPC) communication between an OPC server and a plurality of hardware PLCs which are connected therewith.

Throughout the drawings and the detailed description, unless otherwise described, the same drawing reference numerals will be understood to refer to the same elements, features, and structures. The relative size and depiction of these elements may be exaggerated for clarity, illustration, and convenience.

MODE FOR THE INVENTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 3:
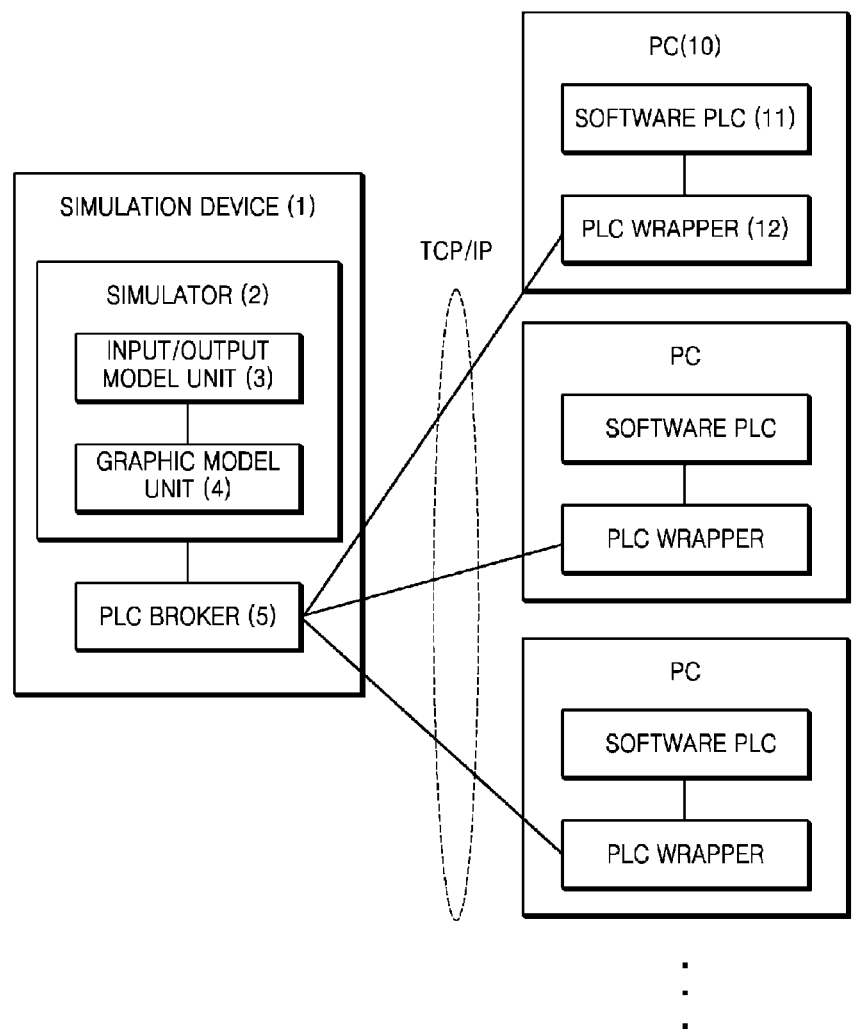
FIG. 3 is a diagram illustrating an example of a configuration of a multiple PLC simulation system.

FIG. 3 illustrates an example of a configuration of a multiple programmable logic controller (PLC) system according to an exemplary embodiment.

Referring to FIG. 3, the multiple PLC simulation system may include a simulation device 1 and a plurality of personal computers (PCs) 10.

A plurality of the PCs 10 may include different software PLCs which are PLCs implemented as software to verify a plurality of PLC codes that generate PLC input signals and PLC output signals for controlling lines and equipment in the automated manufacturing system. In this case, a plurality of the PLCs that control the lines and the equipment in the automated manufacturing system may be hardware PLCs.

Each of the PCs 10 may include a software PLC 11 and a PLC wrapper 12.

The PLC wrapper 12 may transmit to the software PLC 11 a PLC input signal received from the simulation device 1 through a network in which a plurality of the PCs and the simulation device 1 are connected, and transmit a PLC output signal received from the software PLC 11 to the simulation device 1 through the network. The network in which the simulation device 1 and the PCs 10 are connected may be a TCP/IP network.

The software PLC 11 may perform an internal logic operation to generate a PLC output signal in response to the PLC input signal received from the PLC wrapper 12, and transmit the PLC output signal to the PLC wrapper 12. The software PLC 11 may store ladder diagram information in the form of Boolean logic as a control program, and output the PLC output signal by performing a logic operation using the ladder diagram information according to the PLC input signal received from the PLC wrapper 12.

The simulation device 1 may be connected to a plurality of the PCs 10 over the TCP/IP network, and perform a simulation on a plurality of the software PLCs in an effort to verify a plurality of PLC codes using an input/output model and a graphic model where the input/output model defines as discrete events operation states of the lines and the equipment which are controlled according to the PLC output signals received from a plurality of the software PLCs and PLC input signals in accordance with the operation states, and the graphic model graphically represents a motion change of the lines and the equipment in accordance with a change of the operation states using pieces of motion graphic data of the lines and the equipment which correspond to the operation states and the graphic model generates PLC input signals including information on the motion change of the lines and the equipment.

In this case, the PLC input signals generated by the graphic model may be transmitted to a plurality of the software PLCs 11 through the input/output model.

The simulation device 1 may include a simulator 2 and a PLC broker 5.

The PLC broker 5 may transmit to the simulator 2 the PLC output signals which have been received from the PCs 10 through the TCP/IP network. In addition, the PLC broker 5 may receive a plurality of PLC input signals from the simulator 2 and transmit, through the TCP/IP network, each of the PLC input signals to a corresponding PC that generates a PLC output signal from which the PLC input signal is derived.

As such, through the TCP/IP communication between the PLC broker 5 and the PLC wrapper 12 in each PC 10, the PLC input signals and the PLC output signals for PLC code verification may be transmitted between a plurality of the software PLCs 11 and the simulator 2.

Accordingly, drawbacks of a conventional simulation method for PLC code verification in which lines and equipment of an automated manufacturing system are divided on the basis of a unit of PLC control and simulation is performed for verification of individual software PLC codes that correspond to each PLC control unit may be enabled to be solved. More specifically, in the conventional simulation method, a network communication environment cannot be established between a plurality of software PLCs that control the lines and the equipment because simulation for code verification is allowed to be performed by each PC for one software PLC according to a PLC vender type, and as a result, verification of errors and abnormal states which may occur during communication of input/output signals between each software PLC and human machine interface (HMI) cannot be carried out.

In addition, the software PLC 11 is installed in each PC 10, and the plural installed software PLCs allow data transmission between the PLC wrapper 12 in each PC 10 and the PLC broker 5 in the simulation device 1, that is, a network environment is established using the software PLCs, so that a plurality of hardware PLCs are connected to a conventional OLE for process control (OPC) server and thus a simulation system for PLC code verification in units of lines can be substituted. Hence, environment settings for implementing PLC control simulation in units of lines can be simplified and cost for PLC code verification can be reduced.

The simulator 2 may include an input/output model unit 3 and a graphic model unit 4. The input/output model unit 3 stores an input/output model that defines operation states of lines and equipment, which are controlled by PLC output signals received from a plurality of software PLCs, and PLC input signals according to the operation states of the lines and the equipment as discrete events. The graphic model unit 4 may store a graphic model which graphically represent motion changes of lines and equipment according to changes of the operation states of the lines and the equipment using motion graphic data of the lines and the equipment that correspond to the operation states, and which generates PLC input signals that include the motion change information of the lines and the equipment and transmits the generated PLC input signals to a plurality of the software PLCs.

In this case, the simulator 2 may identify whether a PLC code works normally or not based on the occurrence of a change of the operation states of the lines and the equipment in the input/output model, where the operation states are controlled by a plurality of the software PLCs 11 according to the PLC output signals received from a plurality of the software PLCs 11.

That is, when a change of operation states of the lines and the equipment which are controlled by the software PLCs occurs, a PLC input signal according to each operation state is generated in the graphic model and the generated PLC input signal is transmitted to the software PLC. Then, when an operation is performed according to a normal sequence due to a logic operation in a PLC code, it is determined that the PLC code works normally.

On the other hand, if an operation state has not changed, but remained in a particular state, the PLC code may be determined as being defective.

The change of operation states of the lines and the equipment may indicate a transition of discrete events which may occur in the input/output model according to a plurality of PLC output signals wherein the input/output model defines a series of operation states of the lines and the equipment as the discrete events.

In one embodiment, a robot process in an automated manufacturing system is taken as an example to describe PLC code verification of the simulator 2. In response to running the simulation device 1, the graphic model unit 4 generates a predefined PLC input signal with respect to an operation state of, for example, a sensor, and transmits the generated PLC input signal to the software PLC 11 through the PLC broker 5. In response to receiving the PLC input signal, the software PLC 11 performs a logic operation based on ladder diagram information to generate a PLC output signal, and transmits the generated PLC output signal to the input/output model unit 3 in the simulation device 1. In this case, more specifically, the PLC output signal generated by the software PLC 11 is transmitted to the input/output model unit 3 of the simulator 2 through the PLC wrapper 12 and the PLC broker 5. Accordingly, in the input/output model of the input/output model unit 3, a transition of discrete events may take place according to the PLC output signal where the input/output model defines a series of operation states of the robot process including, for example, an original position state, a standby state, and an operating state, as discrete events. Thus, the simulator 2 is enabled to identify whether the PLC code is normal or defective based on the occurrence of the transition of discrete events in the input/output model according to the PLC output signal received from a plurality of the software PLCs 11.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

The invention claimed is:

1. A multiple programmable logic controller (PLC) simulation system comprising:
   a plurality of personal computers (PCs), each being configured to comprise a different software PLC which is one of a plurality of PLCs implemented as software in an effort to verify a plurality of PLC codes that generate a PLC input signal and a PLC output signal for controlling lines and equipment of an automated manufacturing system; and
   a simulation device configured to be connected to a plurality of the PCs over a network, and to perform simulation for verification of a plurality of the PLC codes using an input/output model and a graphic model where the input/output model defines as discrete events operation states of the lines and the equipment which are controlled according to the PLC output signals received from a plurality of the software PLCs and PLC input signals in accordance with the operation states, and the graphic model represents graphically motion change of the lines and the equipment in accordance with a change of operation states using pieces of graphic data of the lines and the equipment which correspond to the operation states and the graphic model generates PLC input signals including information on the motion change of the lines and the equipment,
   wherein the simulation device is further configured to comprise
      a PLC broker configured to transmit to a simulator the PLC output signals received from a plurality of the PCs through the network and to transmit, through the network, a plurality of the PLC input signals, which have been received from the simulator, to the corresponding PCs that generate the respective PLC output signals from which the individual PLC input signals are derived, and
      the simulator configured to comprise an input/output model unit and a graphic model unit, the input output model unit being configured to store the input/output model that defines as discrete events the operation states of the lines and the equipment which are controlled according to the PLC output signals received from a plurality of the software PLCs and the PLC input signals in accordance with the operation states and the graphic model unit being configured to store the graphic model which graphically represents a motion change of the lines and the equipment in accordance with a change of the operation states using pieces of graphic data of the lines and the equipment corresponding to the operation states and which generates the PLC input signals including information on the motion change of the lines and the equipment.

2. The multiple PLC simulation system of claim 1, wherein each of the PCs is further configured to comprise
   a PLC wrapper configured to transmit to the software PLC the PLC input signal received from the simulation device through the network, and to transmit the PLC output signal received from the software PLC to the simulation device through the network, and
   the software PLC configured to perform an internal logic operation according to the PLC input signal received from the PLC wrapper to generate the PLC output signal and to transmit the generated PLC output signal to the PLC wrapper.

3. The multiple PLC simulation system of claim 1, wherein the simulation device is configured to identify whether the PLC codes work normally or not based on a change of operation states of the lines and equipment in the input/output model wherein the operation states are controlled by the software PLCs according to the PLC output signals received from the software PLCs.

4. The multiple PLC simulation system of claim 1, wherein the network is a transmission control protocol/Internet protocol (TCP/IP) network.

5. The multiple PLC simulation system of claim 2, wherein the network is a transmission control protocol/Internet protocol (TCP/IP) network.

6. The multiple PLC simulation system of claim 3, wherein the network is a transmission control protocol/Internet protocol (TCP/IP) network.

* * * * *